United States Patent
Kyono

(10) Patent No.: US 8,823,027 B2
(45) Date of Patent: Sep. 2, 2014

(54) LIGHT EMITTING DEVICE

(75) Inventor: Takashi Kyono, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 52 days.

(21) Appl. No.: 12/836,199

(22) Filed: Jul. 14, 2010

(65) Prior Publication Data

US 2011/0073892 A1    Mar. 31, 2011

(30) Foreign Application Priority Data

Sep. 30, 2009    (JP) ................ P2009-228154

(51) Int. Cl.
- *H01L 33/32* (2010.01)
- *H01L 33/50* (2010.01)
- *H01L 33/08* (2010.01)

(52) U.S. Cl.
CPC ........... *H01L 33/08* (2013.01); *H01L 33/32* (2013.01)
USPC ............. 257/98; 257/E21.125; 257/E33.006

(58) Field of Classification Search
None
See application file for complete search history.

(56) References Cited

U.S. PATENT DOCUMENTS

| | | | | |
|---|---|---|---|---|
| 7,053,413 B2 * | 5/2006 | D'Evelyn et al. | ............... | 257/79 |
| 7,514,721 B2 | 4/2009 | Krames et al. | | |
| 7,728,348 B2 | 6/2010 | Kasai et al. | | |
| 2005/0029506 A1 * | 2/2005 | Lee et al. | ............... | 257/9 |
| 2005/0258483 A1 | 11/2005 | Templier et al. | | |
| 2006/0006396 A1 | 1/2006 | Chua et al. | | |

(Continued)

FOREIGN PATENT DOCUMENTS

| | | |
|---|---|---|
| CN | 101101868 A | 1/2008 |
| JP | 11-17222 A | 1/1999 |

(Continued)

OTHER PUBLICATIONS

Nyein et al., "Spectroscopic studies of GaN:Er, GaN:Eu, and GaN/AlGaN:Tm prepared by Solid-Source Molecular Beam Epitaxy", Proc. Lasewrs and Electro-Optics Society, 2003 (LEOS 2003), 16th Annual Mtg. of the IEEE, vol. 2, pp. 876-877 (2003).*

(Continued)

*Primary Examiner* — Johannes P Mondt
(74) *Attorney, Agent, or Firm* — Venable LLP; Michael A. Sartori; Tamatane J. Aga

(57) ABSTRACT

A light emitting device having a relatively simple configuration is provided that emits stable light having a plurality of wavelengths. The light emitting device 1 comprises, in sequence, a composite substrate 3 and a gallium nitride-based semiconductor layer 5 including a light emitting layer 9. The composite substrate 3 includes a base 19 and a gallium nitride layer, the gallium nitride-based semiconductor layer 5 being disposed on a principal surface of the gallium nitride layer, the angle θ defined by the c-axis of the gallium nitride layer and a normal line N1 to the principal surface S1 of the gallium nitride layer ranging from 50 to 130 degrees, the light emitting layer 9 emitting light with an absolute value of the degree of polarization of 0.2 or more, the base 19 containing a fluorescent material that emits a fluorescent light component induced by irradiation of a light component emitted from the light emitting layer 9. Accordingly, the light emitting device 1 can emit white light produced by superposition of blue light directly emitted from the light emitting layer 9 and yellow light induced by blue light incident on the base 19 from the light emitting layer 9.

6 Claims, 4 Drawing Sheets

(56) References Cited

U.S. PATENT DOCUMENTS

| | | |
|---|---|---|
| 2006/0006397 A1 | 1/2006 | Chua et al. |
| 2007/0126017 A1 | 6/2007 | Krames et al. |
| 2007/0159064 A1* | 7/2007 | Choi et al. .................... 313/502 |
| 2008/0169483 A1 | 7/2008 | Kasai et al. |
| 2008/0203414 A1* | 8/2008 | Yen et al. ........................ 257/98 |
| 2008/0230766 A1 | 9/2008 | Okamoto et al. |
| 2009/0155943 A1 | 6/2009 | Krames et al. |
| 2010/0210089 A1 | 8/2010 | Kasai et al. |
| 2010/0244087 A1* | 9/2010 | Horie et al. ................... 257/103 |

FOREIGN PATENT DOCUMENTS

| | | | |
|---|---|---|---|
| JP | 2000-164931 | | 6/2000 |
| JP | 2001-274507 A | | 10/2001 |
| JP | 2004-253592 A | | 9/2004 |
| JP | 2005-537679 T | | 12/2005 |
| JP | 2006-024935 | | 1/2006 |
| JP | 2007-150331 A | | 6/2007 |
| JP | 2007-290960 A | | 11/2007 |
| JP | 2008-010766 A | | 1/2008 |
| JP | 2008-159606 A | | 7/2008 |
| JP | 2008-218645 A | | 9/2008 |
| JP | 2008-235804 A | | 10/2008 |
| JP | WO-2009-066466 A1 * | 5/2009 | ............ H01L 21/205 |
| JP | 2009-130360 A | | 6/2009 |

OTHER PUBLICATIONS

Sizov et al., "500-nm Optical Gain Anisotropy of Semipolar (1122) InGaN Quantum Wells," The Japan Society of Applied Physics, Applied Physics Express 2, pp. 071001-1-071001-3 (2009).

Notice of Reasons for Rejection in Japanese Patent Application No. 2009-228154, dated Oct. 29, 2013.

Final Rejection in Japanese Patent Application No. 2009-228154, dated Mar. 25, 2014.

* cited by examiner

LIGHT EMITTING DEVICE

BACKGROUND OF THE INVENTION

1. Field of the Invention

The present invention relates to a light emitting device.

2. Related Background Art

In recent years, light emitting devices that emit light having a plurality of wavelengths (colors) have been developed. Patent Literature 1 (Japanese Unexamined Patent Application Publication No. 2008-159606) discloses a nitride semiconductor light emitting device comprising a GaN semiconductor layer formed on a GaN substrate, the GaN semiconductor layer including a first and second quantum well layers that emit light having different wavelengths. A color mixture of colors of light components emitted from the first and second active layers is observed. Patent Literature 2 (Japanese Unexamined Patent Application Publication No. 2008-218645) discloses a light emitting device comprising a blue light emitting diode chip and a yellow light emitting diode chip that are mounted on a supporting substrate, thereby producing white light obtained by mixing light components emitted from the two light emitting diodes. Patent Literature 3 (Japanese Unexamined Patent Application Publication No. 2008-235804) discloses a light emitting device comprising a group-III nitride semiconductor substrate and an active layer, the group-III nitride semiconductor substrate emitting longer-wavelength light induced by absorption of ultraviolet light, and the active layer being disposed on the group-III nitride semiconductor substrate and emitting light including the ultraviolet light component. Patent Literature 4 (Japanese Unexamined Patent Application Publication No. 2004-253592) discloses a white light emitting device comprising an InGaN-LED that emits blue light and a ZnSSe fluorescent plate that emits yellow light induced by absorption of the blue light. Patent Literature 5 (Japanese Unexamined Patent Application Publication No. 2007-150331) discloses a wavelength converter that emits light having a different wavelength from that of incident light by means of a phosphor contained in a composite substrate. Patent Literature 6 (Japanese Unexamined Patent Application Publication (Translation of PCT Application) No. 2005-537679) and Patent Literature 7 (Japanese Unexamined Patent Application Publication No. 2008-010766) disclose art concerning composite substrates. Non-patent Literature 1 (Dmitry S. Sizov, Rajaram Bhat, Jerome Napierala, Chad Gallinat, Kechang Song, and Chung-en Zah, "500-nm Optical Gain Anisotropy of Semipolar (11-22) InGaN Quantum Wells", Applied Physics Express 2 (2009) 071001) discloses polarization of light emitted from an InGaN well layer.

SUMMARY OF THE INVENTION

As can be seen from these disclosures, light emitting devices that emit light having a plurality of wavelengths (colors) have been developed. However, because of insufficient polarization properties, insufficient light emitting efficiency, complexity of configuration, or the like, a light emitting device having a relatively simple configuration and exhibiting sufficient polarization properties and sufficient light emitting efficiency is desired. The present invention is accomplished in view of the above-described circumstances, and an object of the present invention is to provide a light emitting device that emits stable light having a plurality of wavelengths.

A light emitting device according to one aspect of the present invention comprises: a substrate; and a hexagonal gallium nitride-based semiconductor layer having a light emitting layer which contains indium, the substrate including a base and a gallium nitride layer which has a thickness less than a thickness of the base, the hexagonal gallium nitride-based semiconductor layer being disposed on a principal surface of the gallium nitride layer, an angle between a c-axis of the gallium nitride layer and a normal line to the principal surface of the gallium nitride layer being in a range of not less than 50 degree and not more than 130 degree, the light emitting layer emitting light with an absolute value of the degree of polarization of not less than 0.2, the base containing a fluorescent material that emits a fluorescent light component which is induced by irradiation of a light component emitted from the light emitting layer.

According to the aspect of the present invention, the light emitting device can emit light produced by superposition of a light component emitted from the light emitting layer and a light component induced by a light component incident on the base from the light emitting layer. Because an angle between the c-axis of the gallium nitride layer and the normal line to the principal surface of the gallium nitride layer is in a range of not less than 50 degree and not more than 130 degree, indium content in the light emitting layer is relatively high, and thus, it allows for emission of high-intensity light. Because the angle between the c-axis of the gallium nitride layer and the normal line to the principal surface of the gallium nitride layer is in a range of not less than 50 degree and not more than 130 degree, the piezoelectric field is relatively weak, and thus, it allows for a relatively smaller variation width in wavelength of light from the light emitting layer which is induced by a variation in drive current. The absolute value of the degree of polarization of not less than 0.2 indicates a relatively high degree of polarization.

In this light emitting device, the base comprises: a phosphor layer containing the fluorescent material; and a support layer being disposed on a principal surface of the phosphor layer, the gallium nitride layer being disposed on a principal surface of the support layer. This enables a material of the support layer to be selected so as to give satisfactory lamination with the gallium nitride layer.

The light emitting device further comprising a reflective layer which is disposed on the back surface of the phosphor layer, the reflective layer reflecting light which is emitted from the phosphor layer. Therefore, it allows for an improvement in utilization efficiency of light incident on the phosphor layer.

In the light emitting device, the gallium nitride layer has a thickness in a range of not less than 100 nm and not more than 1200 nm. Therefore, it allows for compatibility of high-quality and low cost of the substrate.

In the light emitting device, the light emitting layer emits light having a peak wavelength in a range of not less than 430 nm and not more than 490 nm.

In the light emitting device, the fluorescent material contains a component that emits light having a peak wavelength in a range of not less than 540 nm and not more than 600 nm. Accordingly, white light can be obtained by superposition of the blue light from the light emitting layer and the yellow light produced by the fluorescence material of the base.

In the light emitting device, the fluorescent material contains polycrystalline $ZnS_xSe_{1-x}$ ($0 \leq x \leq 1$) doped with at least one impurity element selected from the group consisting of aluminum, indium, gallium, chlorine, bromine, and iodine. Polycrystalline $ZnS_xSe_{1-x}$ can absorb blue light to emit yellow light.

DESCRIPTION OF THE PREFERRED EMBODIMENTS

Figure 1:
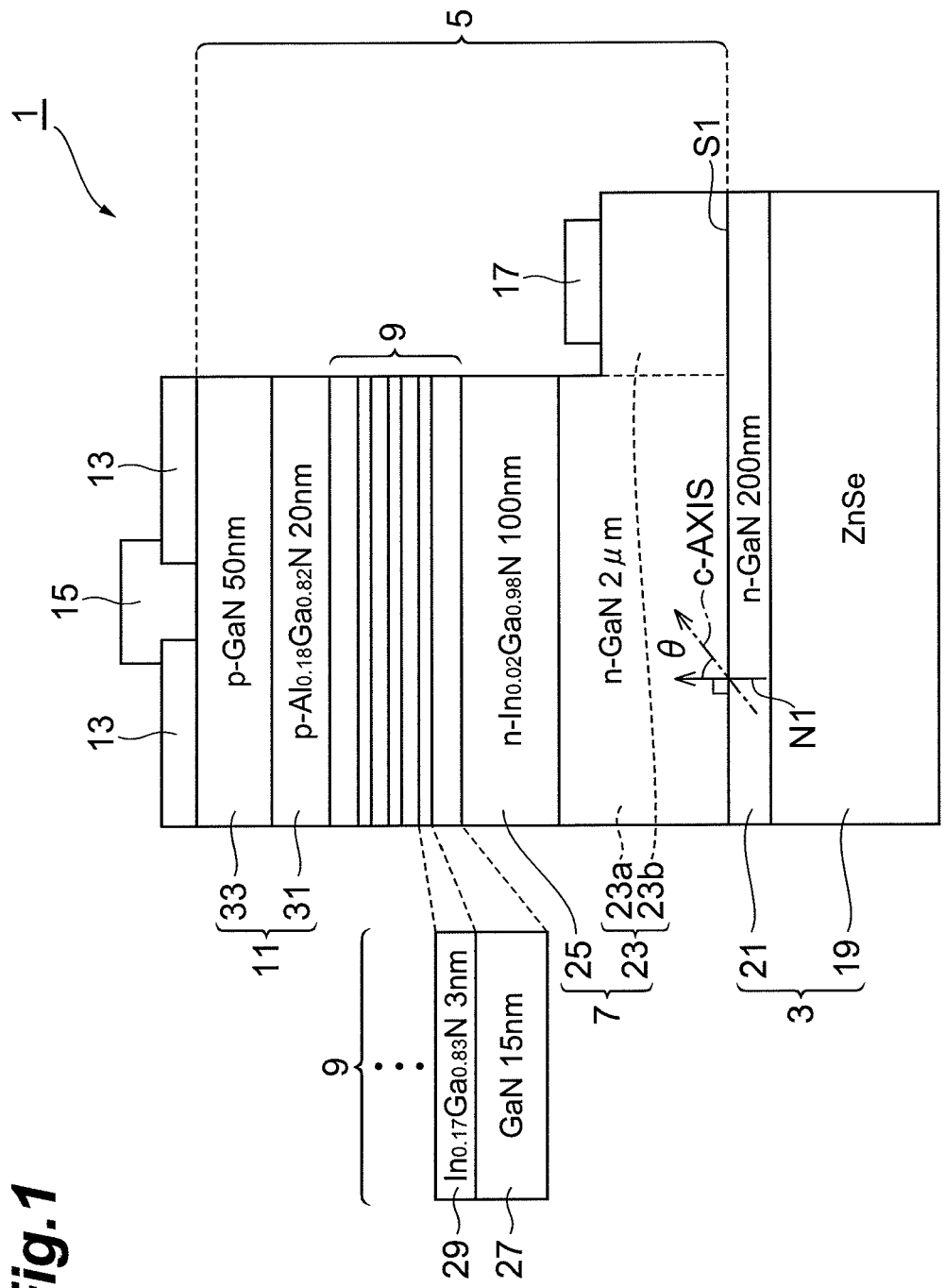
FIG. 1 is a drawing showing a configuration of a light emitting device according to the embodiment.

Preferred embodiments according to the present invention will be described with reference to the attached drawings. In order to avoid redundancy in description of the drawings, the same elements are designated by the same reference numerals, wherever possible. In FIG. 1, a configuration of a light emitting device 1 according to the embodiment is shown. The light emitting device 1 comprises a composite substrate 3, a gallium nitride-based semiconductor layer 5, a p-electrode 13, a pad electrode 15, and an n-electrode 17. The composite substrate 3 includes a base 19 and a GaN layer 21. The base 19 contains a fluorescent material that emits a fluorescent light component induced by irradiation of a light component emitted from a light emitting layer 9 as described below. The fluorescent material contains a component that emits yellow light having a peak wavelength in a range of not less than 540 nm and not more than 600 nm by absorbing blue light having a peak wavelength in a range of not less than 430 nm and not more than 490 nm.

The GaN layer 21 is disposed on the base 19. The GaN layer 21 is in contact with the base 19. The GaN layer 21 has a thickness less than that of the base 19 (hereinafter, "thickness" refers to a width in a direction of a normal line N1 to a principal surface S1 of the GaN layer 21).

The gallium nitride-based semiconductor layer 5 includes an n-type nitride semiconductor layer 7, a light emitting layer 9, and a p-type nitride semiconductor layer 11. The n-type nitride semiconductor layer 7, the light emitting layer 9, and the p-type nitride semiconductor layer 11 comprise a hexagonal gallium nitride-based semiconductor. The gallium nitride-based semiconductor layer 5 is disposed on the principal surface S1 of the GaN layer 21. The gallium nitride-based semiconductor layer 5 is in contact with the GaN layer 21. The gallium nitride-based semiconductor layer 5 is deposited by epitaxially growing on the principal surface S1 of the GaN layer 21.

The n-type nitride semiconductor layer 7 includes a GaN layer 23 and a buffer layer 25. The GaN layer 23 comprises a first region 23a and a second region 23b. The first region 23a and the second region 23b are disposed in parallel on the principal surface S1 of the GaN layer 21. Both of the first region 23a and the second region 23b are in contact with the GaN layer 21. The buffer layer 25 is disposed on the first region 23a. The buffer layer 25 is in contact with the first region 23a. The first region 23a, the buffer layer 25, the light emitting layer 9, and the p-type nitride semiconductor layer 11 are deposited in sequence on the principal surface S1 of the GaN layer 21. The n-electrode 17 is disposed on the first region 23a and is in ohmic contact with the second region 23b. The first region 23a has a thickness greater than that of the second region 23b.

The light emitting layer 9 includes barrier layers 27 and well layers 29 which are alternatively deposited to form a multiple quantum well structure. The light emitting layer 9 is disposed on the buffer layer 25. The light emitting layer 9 is in contact with the buffer layer 25. The barrier layers 27 and the well layers 29 are alternatively deposited in a direction orthogonal to the normal line N1. The light emitting layer 9 emits blue light having a peak wavelength in a range of not less than 430 nm and not more than 490 nm.

The p-type nitride semiconductor layer 11 includes an electron-blocking layer 31 and a contact layer 33. The electron-blocking layer 31 is disposed on the light emitting layer 9. The electron-blocking layer 31 is in contact with the light emitting layer 9. The contact layer 33 is disposed on the electron-blocking layer 31. The contact layer 33 is in contact with the electron-blocking layer 31.

The p-electrode 13 is disposed on the contact layer 33, and is in ohmic contact with the contact layer 33. The pad electrode 15 is disposed on the p-electrode 13 and the contact layer 33. The pad electrode 15 is in contact with the contact layer 33 through an aperture of the p-electrode 13. It allows for excellent adhesiveness.

The configuration of the light emitting device 1 will be described further in detail. The base 19 comprises generally polycrystalline ZnSe doped with at least one impurity element selected from the group consisting of aluminum, indium, gallium, chlorine, bromine, and iodine, and preferably polycrystalline $ZnS_xSe_{1-x}$, ($0 \le x \le 1$) doped with at least one impurity element selected from the group consisting of aluminum, indium, gallium, chlorine, bromine, and iodine. The GaN layer 21 comprises n-type-doped GaN. The GaN layer 21 generally has a thickness of about 200 nm, and preferably in a range of not less than 100 nm and not more than 1200 nm. The GaN layer 21 has a dislocation density of not more than $1 \times 10^7$ cm$^{-2}$. The angle θ between the normal line N1 to the GaN layer 21 and the c-axis of the GaN layer 21 indicates that the principal surface S1 of the GaN layer 21 is identical to the m-plane of GaN crystal. The angle θ is preferably in a range of not less than 50 degree and not more than 130 degree.

The GaN layer 23 comprises n-type-doped GaN, and the first region 23a has a thickness of about 2 μm. The buffer layer 25 comprises n-type-doped InGaN, and has a thickness of about 100 nm. The composition ratios of indium and gallium in the buffer layer 25 are 0.02 and 0.98, respectively.

The barrier layer 27 comprises GaN, and has a thickness of about 15 nm. The well layer 29 comprises InGaN, and has a thickness of about 3 nm. The composition ratios of indium and gallium in the well layer 29 are 0.17 and 0.83, respectively. Because the angle θ is in a range of not less than 50 degree and not more than 130 degree, the composition ratio of indium in the well layer 29 is relatively high, and thus, the light emitting layer 9 becomes capable of emitting high-intensity blue light. Additionally, because the angle θ is in a range of not less than 50 degree and not more than 130 degree, the piezoelectric field is relatively weak in the light emitting layer 9, and thus, it allows for a relatively smaller variation width in wavelength of light from the light emitting layer 9 which is induced by a variation in drive current.

In addition, because the angle θ is in a range of not less than 50 degree and not more than 130 degree, the light emitting layer 9 emits blue light with an absolute value of the degree of polarization of not less than 0.2. In the embodiment, the degree of polarization is defined by (I1−I2)/(I1+I2), where I1 represents a polarized light component in a direction perpendicular to a direction of the projected c-axis of the hexagonal group-III nitride semiconductor onto a principal surface, and I2 represents a polarized light component in the direction of the projected c-axis of the hexagonal group-III nitride semiconductor onto the principal surface. The polarized light component I1 is larger than the polarized light component I2.

The electron-blocking layer 31 comprises p-type-doped AlGaN, and has a thickness of about 20 nm. The composition ratios of aluminum and gallium in the electron-blocking layer 31 are 0.18 and 0.82, respectively. The contact layer 33 comprises p-type-doped GaN, and has a thickness of about 50 nm. The p-electrode 13 comprises nickel/gold (Ni/Au), the pad electrode 15 titanium/gold (Ti/Au), and the n-electrode 17 titanium/aluminum (Ti/Al).

An exemplary method of manufacturing the light emitting device 1 will be described. A GaN layer 21 is processed so as to have the back surface (the surface opposite to the principal surface S1) with an average surface roughness Ra of not more than 1 nm. A base 19 is compressively bonded to the back surface of the GaN layer 21 under heat to laminate the base 19 and the GaN layer 21, and thus, a composite substrate 3 is provided. The back surface of the GaN layer 21 having an average surface roughness Ra of not more than 1 nm results in sufficiently strong lamination of the base 19 and the GaN layer 21.

Then, a gallium nitride-based semiconductor layer 5 is formed on the principal surface S1 of the GaN layer 21. An n-type-doped GaN layer (corresponding to a GaN layer 23) is deposited by epitaxy on the principal surface S1 of the GaN layer 21 at a temperature of 840° C. into a thickness of about 2 μm. An n-type-doped InGaN layer (corresponding to a buffer layer 25) is deposited by epitaxy on a surface of the GaN layer with a thickness of about 2 μm at a temperature of 840° C. into a thickness of about 100 nm. In the n-type-doped InGaN layer, the composition ratios of indium and gallium are 0.02 and 0.98, respectively. Subsequently, a light emitting layer (corresponding to a light emitting layer 9) having a multiple quantum well structure including GaN barrier layers (corresponding to barrier layers 27) and InGaN well layers (corresponding to well layers 29) is deposited by epitaxy on a surface of the InGaN layer with a thickness of about 100 nm. In each of the InGaN well layers, the composition ratios of indium and gallium are 0.17 and 0.83, respectively. Each of the barrier layers is deposited at a temperature of 840° C. into a thickness of about 15 nm, and each of the well layers is deposited at a temperature of 780° C. into a thickness of about 3 nm.

A p-type-doped AlGaN layer (corresponding to an electron-blocking layer 31) is deposited on the light emitting layer at a temperature of 840° C. into a thickness of about 20 nm. In the p-type-doped AlGaN layer, the composition ratios of aluminum and gallium are 0.18 and 0.82, respectively. Subsequently, a p-type-doped GaN layer (corresponding to a contact layer 33) is deposited on the AlGaN layer at a temperature of 840° C. into a thickness of about 50 nm. Then, the p-type GaN layer with a thickness of about 50 nm, the p-type AlGaN layer with a thickness of about 20 nm, the light emitting layer, the n-type InGaN layer with a thickness of about 100 nm, and the n-type GaN layer with a thickness of about 2 μm are dry-etched to form the contact layer 33, the electron-blocking layer 31, the light emitting layer 9, the buffer layer 25, and the GaN layer 23 (a first region 23a and a second region 23b). As described above, the gallium nitride-based semiconductor layer 5 is deposited by epitaxy on the principal surface S1 of the GaN layer 21.

A p-electrode 13 is deposited on a surface of the contact layer 33 by vacuum vapor deposition. And then, a pad electrode 15 is deposited on a surface of the contact layer 33 and a surface of the p-electrode 13 by vacuum vapor deposition, and an n-electrode 17 is deposited on a surface of the second region 23b by vacuum vapor deposition.

The light emitting device 1 fabricated according to the method is operated by current injection. The light emitting layer 9 emits blue light having a peak wavelength of 470 nm, while the base 19, excited by absorption of the blue light from the light emitting layer 9, emits yellow light. Accordingly, white light obtained by superposition of the blue light and the yellow light is observed. The degree of polarization of the blue light emitted from the light emitting layer 9 is 0.84.

The light emitting device 1 can emit white light produced by superposition of blue light directly emitted from the light emitting layer 9 and yellow light induced by blue light incident on the base 19 from the light emitting layer 9. Because of the angle θ is in a range of not less than 50 degree and not more than 130 degree, indium content in the light emitting layer 9 is relatively high, and thus, it allows for emission of high-intensity light. Because the angle θ is in a range of not less than 50 degree and not more than 130 degree, the piezoelectric field is relatively weak, and thus, it allows for a relatively smaller variation width in wavelength of light from the light emitting layer 9 which is induced by a variation in drive current. The absolute value of the degree of polarization of not less than 0.2 indicates a relatively high degree of polarization.

Figure 2:
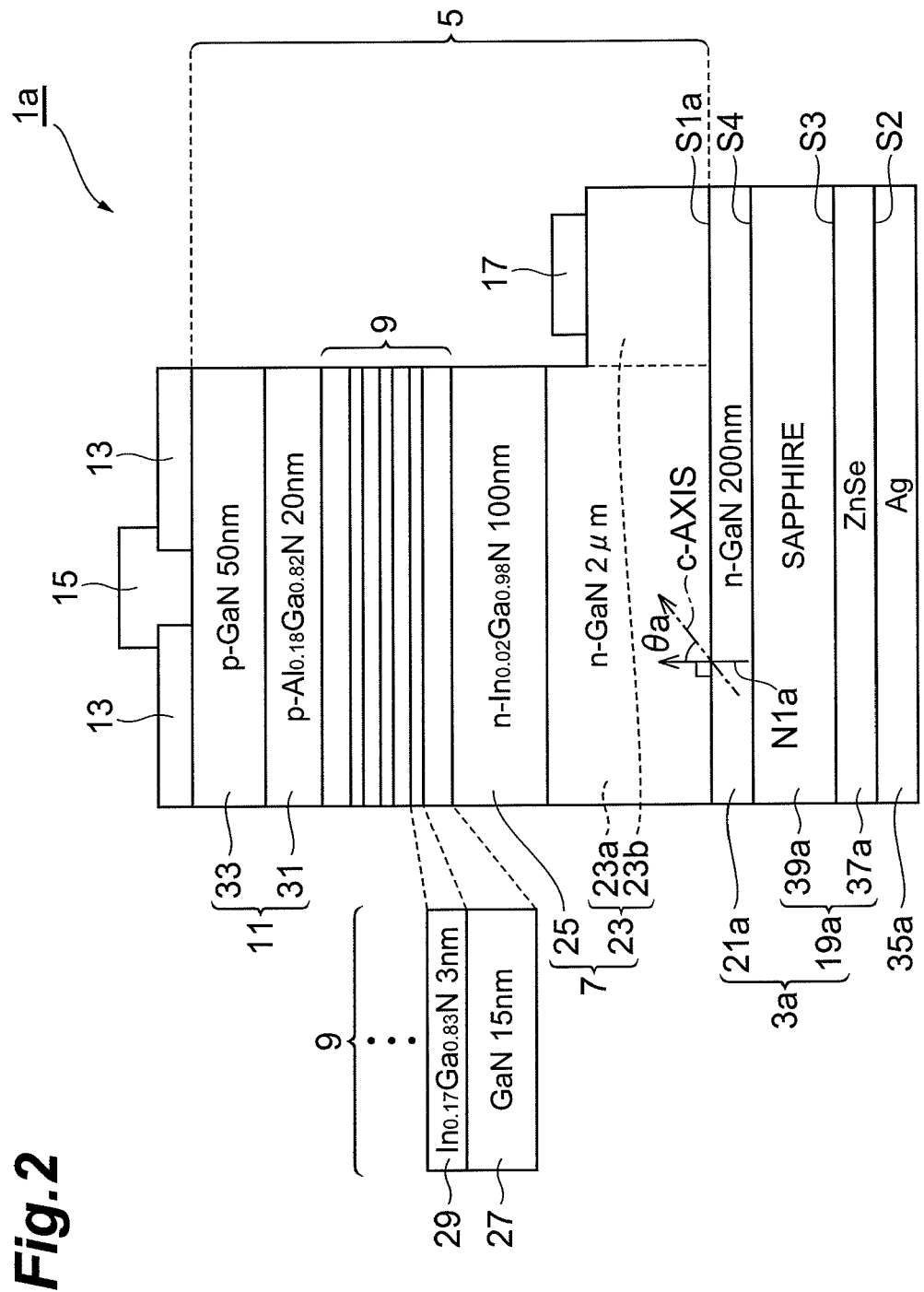
FIG. 2 is a drawing showing a configuration of another light emitting device according to the embodiment.

In FIG. 2, a configuration of a light emitting device 1a according to another embodiment is shown. The light emitting device 1a includes a composite substrate 3a in place of the composite substrate 3 of the light emitting device 1 in FIG. 1. The light emitting device 1a includes a reflective layer 35a. The light emitting device 1a has the same configuration as the light emitting device 1, except for the composite substrate 3a and the reflective layer 35a. The composite substrate 3a has a base 19a and a GaN layer 21a. The base 19a includes a phosphor layer 37a and a support layer 39a. The reflective layer 35a, the phosphor layer 37a, the support layer 39a, and the GaN layer 21a are deposited in sequence. The reflective layer 35a is disposed on the back surface S2 of the phosphor layer 37a. The reflective layer 35a is in contact with the phosphor layer 37a. The support layer 39a is disposed on a principal surface S3 of the phosphor layer 37a. The support layer 39a is in contact with the phosphor layer 37a. The GaN layer 21a is disposed on a principal surface S4 of the support layer 39a. The GaN layer 21a is in contact with the support layer 39a.

The reflective layer 35a reflects light emitted from the phosphor layer 37a, and comprises a metal that has high reflectivity (for example, silver). The phosphor layer 37a, having a thickness sufficient to absorb substantially all blue light incident thereon from a light emitting layer 9, places no limitation on flatness of the interface between the phosphor layer 37a and the reflective layer 35a. On the other hand, the phosphor layer 37a, having a thickness sufficiently less than such a thickness, preferably requires a highly flat interface between the phosphor layer 37a and the reflective layer 35a, so that the reflective layer 35a is a mirror, in order to reduce diffused reflection of blue light generated on the interface between the phosphor layer 37a and the reflective layer 35a, (that is, to avoid a reduction in the degree of polarization of the blue light).

The phosphor layer 37a, like the base 19, comprises generally polycrystalline ZnSe doped with at least one impurity element selected from the group consisting of aluminum, indium, gallium, chlorine, bromine, and iodine, and preferably polycrystalline $ZnS_xSe_{1-x}$, ($0 \leq x \leq 1$) doped with at least one impurity element selected from the group consisting of aluminum, indium, gallium, chlorine, bromine, and iodine. The support layer 39a comprises, for example, monocrystalline sapphire that can sufficiently transmit blue light emitted from the light emitting layer 9, and can be satisfactorily formed on the GaN layer.

The GaN layer 21a comprises n-type-doped GaN. The GaN layer 21a generally has a thickness of about 200 nm, and preferably in a range of not less than 100 nm and not more than 1200 nm. The GaN layer 21a has a dislocation density of not more than $1\times10^7$ cm$^{-2}$. An angle θa between a normal line N1a to a principal surface S1a of the GaN layer 21a and the c-axis of a GaN crystal of the GaN layer 21a is 105 degrees, which indicates that the principal surface S1a is identical to the (20-2-1) plane of the GaN crystal. The angle θa is preferably in a range of not less than 50 degree and not more than 130 degree.

An exemplary method of manufacturing the light emitting device 1a will be described. As shown in Part (A) of FIG. 3, a support layer 39a is compressively bonded on a principal surface S3 of a phosphor layer 37a under heat to laminate the phosphor layer 37a and the support layer 39a, and then a GaN layer 41 is compressively bonded on a principal surface S4 of the support layer 39a under heat to laminate the support layer 39a and the GaN layer 41. Here, the GaN layer 41 is processed in advance so as to have a surface with an average surface roughness Ra of 1 nm. The surface is made in contact with the principal surface S4 of the support layer 39a, and then, the support layer 39a and the GaN layer 41 are compressively bonded together under heat to laminate the support layer 39a and the GaN layer 41. Accordingly, the GaN layer 41 having an average surface roughness Ra of not more than 1 nm results in sufficiently strong lamination of the support layer 39a and the GaN layer 41.

Figure 3:
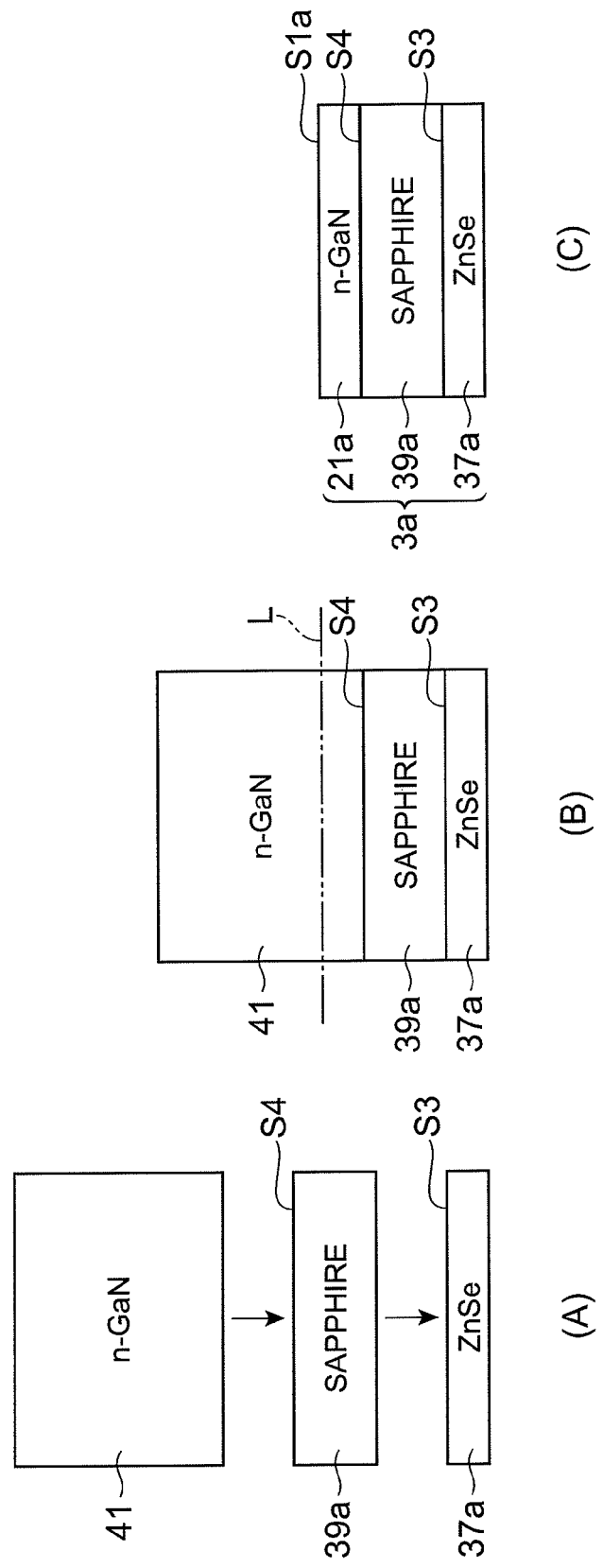
FIG. 3 is a drawing illustrating a method of manufacturing an another light emitting device according to the embodiment.

The GaN layer 41 is cut along a cutting surface L with a wire-saw, as shown in Part (B) of FIG. 3, to form a GaN layer 21a from the GaN layer 41, as shown in Part (C) of FIG. 3. The cutting surface L is parallel to the principal surface S3 (or the principal surface S4). Consequently, a composite substrate 3a including the phosphor layer 37a, the support layer 39a, and the GaN layer 21a is formed.

In the same manner as that for the light emitting device 1, a gallium nitride-based semiconductor layer 5 is deposited by epitaxy on the principal surface S1a of the GaN layer 21a. In addition, a p-electrode 13, a pad electrode 15, and an n-electrode 17 are deposited by vacuum vapor deposition. A reflective layer 35a is deposited on the back surface S2 of the phosphor layer 37a by vacuum vapor deposition.

Figure 4:
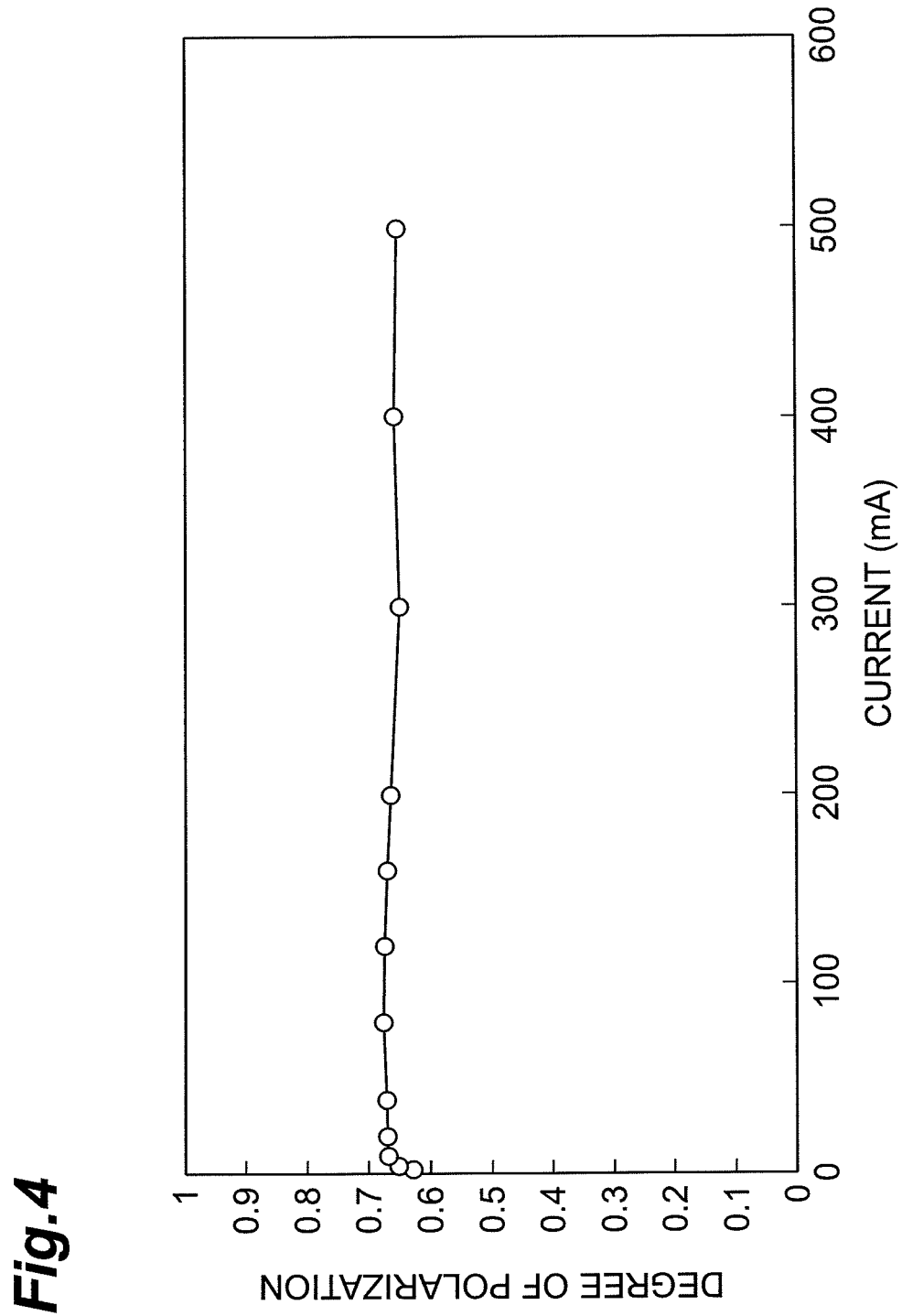
FIG. 4 is a drawing showing drive current dependence of the degree of polarization according to the embodiment.

The light emitting device 1a fabricated according to the method is operated by current injection. A light emitting layer 9 emits blue light having a peak wavelength of 470 nm, while the phosphor layer 37a, excited by absorption of the blue light from the light emitting layer 9, emits yellow light. Accordingly, white light obtained by superposition of the blue light and the yellow light is observed. In FIG. 4, observed values of drive current dependence of the degree of polarization of blue light emitted from the light emitting device 1a is shown. The absolute value of the degree of polarization of the blue light emitted from the light emitting device 1a in a range of not less than 0.63 (a current of 2 mA) and not more than 0.65 (a current of 500 mA), which indicates a relatively smaller variation in the degree of polarization. Therefore, it is found that the light emitting device 1a can be used at a wide range of drive currents.

The light emitting device 1a can emit white light produced by superposition of blue light directly emitted from the light emitting layer 9 and yellow light induced by blue light incident on the phosphor layer 37a from the light emitting layer 9. Because the angle θa is in a range of not less than 50 degree and not more than 130 degree, indium content in the light emitting layer 9 is relatively high, and thus, it allows for emission of high-intensity light. Because the angle θa is in a range of not less than 50 degree and not more than 130 degree, the piezoelectric field is relatively weak, and thus, it allows for a relatively smaller variation width in wavelength of light from the light emitting layer 9, which is induced by a variation in drive current. The absolute value of the degree of polarization of not less than 0.2 indicates a relatively high degree of polarization. Accordingly, in the embodiment, a light emitting device that emits stable light having a plurality of wavelengths is provided.

What is claimed is:

1. A light emitting device comprising:
   a substrate; and
   a hexagonal gallium nitride-based semiconductor layer epitaxially grown on the substrate and having a light emitting layer which contains indium,
   the substrate including a base and a gallium nitride layer which has a thickness less than a thickness of the base, the gallium nitride layer having a dislocation density of not more than $1\times10^7$cm$^{-2}$,
   the hexagonal gallium nitride-based semiconductor layer being disposed on a principal surface of the gallium nitride layer,
   an angle between a c-axis of the gallium nitride layer and a normal line to the principal surface of the gallium nitride layer being in a range of not less than 50 degree and not more than 130 degree, wherein, based on the angle range, the light emitting layer emits light with an absolute value of the degree of polarization of not less than 0.2,
   the base containing a fluorescent material that emits a fluorescent light component which is induced by irradiation of a light component emitted from the light emitting layer, wherein the base comprises a phosphor layer containing the fluorescent material, a support layer being disposed on a principal surface of the phosphor layer, the gallium nitride layer being disposed on a principal surface of the support layer, and
   a reflective layer which is disposed on the back surface of the phosphor layer, the reflective layer reflecting light which is emitted from the phosphor layer.

2. The light emitting device according to claim 1, wherein the gallium nitride layer has a thickness in a range of not less than 100 nm and not more than 1200 nm.

3. The light emitting device according to claim 1, wherein the light emitting layer emits light having a peak wavelength in a range of not less than 430 nm and not more than 490 nm.

4. The light emitting device according to claim 3, wherein the fluorescent material contains a component that emits light having a peak wavelength in a range of not less than 540 nm and not more than 600 nm.

5. The light emitting device according to claim 4, wherein the fluorescent material contains polycrystalline $ZnS_xSe_{1-x}$ ($0\leq x\leq 1$) doped with at least one impurity element selected from the group consisting of aluminum, indium, gallium, chlorine, bromine, and iodine.

6. A light emitting device comprising:
   a substrate; and
   a hexagonal gallium nitride-based semiconductor layer epitaxially grown on the substrate and having a light emitting layer which contains indium,
   the substrate including a base and a gallium nitride layer which has a thickness less than a thickness of the base, the gallium nitride layer having a dislocation density of not more than $1\times10^7$cm$^{-2}$,
   the hexagonal gallium nitride-based semiconductor layer being disposed on a principal surface of the gallium nitride layer,
   an angle between a c-axis of the gallium nitride layer and a normal line to the principal surface of the gallium nitride layer being in a range of not less than 50 degree and not more than 130 degree, wherein, based on the angle range, the light emitting layer emits light with an absolute value of the degree of polarization of not less than 0.2, the base containing a fluorescent material that emits a fluorescent light component which is induced by irradiation of a light component emitted from the light emitting layer, wherein the light emitting layer emits light having a peak wavelength in a range of not less than 430 nm and not more than 490 nm, wherein the fluorescent material contains a component that emits light having a peak wavelength in a range of not less than 540 nm and not more than 600 nm, and wherein the fluorescent material contains polycrystalline $ZnS_xSe_{1-x}$ ($0 \leq x \leq 1$) doped with at least one impurity element selected from the group consisting of aluminum, indium, gallium, chlorine, bromine, and iodine.

\* \* \* \* \*